(12) United States Patent
Nakamura

(10) Patent No.: US 9,814,135 B2
(45) Date of Patent: Nov. 7, 2017

(54) PRINTED WIRING BOARD AND METHOD FOR MANUFACTURING THE SAME

(71) Applicant: IBIDEN CO., LTD., Ogaki (JP)

(72) Inventor: Takenobu Nakamura, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 106 days.

(21) Appl. No.: 14/484,675

(22) Filed: Sep. 12, 2014

(65) Prior Publication Data

US 2015/0068791 A1    Mar. 12, 2015

(30) Foreign Application Priority Data

Sep. 12, 2013    (JP) .................. 2013-189800

(51) Int. Cl.
*H05K 1/11* (2006.01)
*H05K 3/34* (2006.01)

(52) U.S. Cl.
CPC .............. *H05K 1/111* (2013.01); *H05K 1/113* (2013.01); *H05K 3/3452* (2013.01); *H05K 2201/09381* (2013.01); *Y02P 70/611* (2015.11); *Y10T 29/4916* (2015.01)

(58) Field of Classification Search
USPC ....................................................... 174/257
See application file for complete search history.

(56) References Cited

U.S. PATENT DOCUMENTS

| | | | | |
|---|---|---|---|---|
| 7,005,750 B2* | 2/2006 | Liu | ................... | H01L 23/49811 257/775 |
| 7,064,435 B2* | 6/2006 | Chung | .............. | H01L 23/49816 257/737 |
| 7,098,407 B2* | 8/2006 | Kim | .................... | H05K 3/3452 174/255 |
| 7,479,704 B2* | 1/2009 | Fan | ......................... | H01L 23/13 257/700 |
| 8,129,841 B2* | 3/2012 | Pendse | .................. | H01L 21/563 257/737 |
| 2002/0070451 A1* | 6/2002 | Burnette | ........... | H01L 23/49838 257/737 |
| 2004/0113285 A1* | 6/2004 | Tay | ................... | H01L 23/49816 257/786 |
| 2006/0220246 A1* | 10/2006 | Kim | .................. | H01L 23/49816 257/738 |
| 2006/0244142 A1* | 11/2006 | Waidhas | ............. | H01L 23/3128 257/738 |

(Continued)

FOREIGN PATENT DOCUMENTS

JP    2004-022713    *    1/2004
JP    2004-22713  A        1/2004

*Primary Examiner* — Michael F McAllister
(74) *Attorney, Agent, or Firm* — Oblon, McClelland, Maier & Neustadt, L.L.P.

(57) ABSTRACT

A wiring board includes a substrate, pads formed on an electronic-component mounting surface of the substrate, and a resin insulation layer covering the electronic-component mounting surface and having opening portions such that the opening portions are exposing the pads, respectively. The pads include a non-solder mask defined pad having a wiring portion and a non-solder mask defined pad having no wiring portion, and the opening portions are formed such that the non-solder mask defined pads have exposed conductor areas which have substantially same areas inside the opening portions.

10 Claims, 11 Drawing Sheets embodiment of the present invention

(56) References Cited

U.S. PATENT DOCUMENTS

| | | | | |
|---|---|---|---|---|
| 2006/0246702 A1* | 11/2006 | Kim | ................... | H05K 3/3452 |
| | | | | 438/611 |
| 2006/0284316 A1* | 12/2006 | Kim | ................ | H01L 23/49811 |
| | | | | 257/738 |
| 2007/0114674 A1* | 5/2007 | Brown | .................. | H01L 24/10 |
| | | | | 257/780 |
| 2008/0298034 A1* | 12/2008 | Park | ..................... | H05K 1/114 |
| | | | | 361/783 |

* cited by examiner

SMD

NSMD

NSMD (without connected line)

NSMD (with connected line)

NSMD (one lead line)

NSMD (two lead lines)

NSMD (three lead lines)

NSMD (four lead lines)

SMD

NSMD

NSMD (one lead line: opening with correction)

NSMD (one lead line: opening without correction)

NSMD (two lead lines: opening with correction)

NSMD (two lead lines: opening without correction)

(with connected line)  (without connected line)

D1=D1
P1=P2+L1>P2 conventional technology (with connected line)  (without connected line)

D2=D1−D3<D1
P2' ≒ P2 embodiment of the present invention

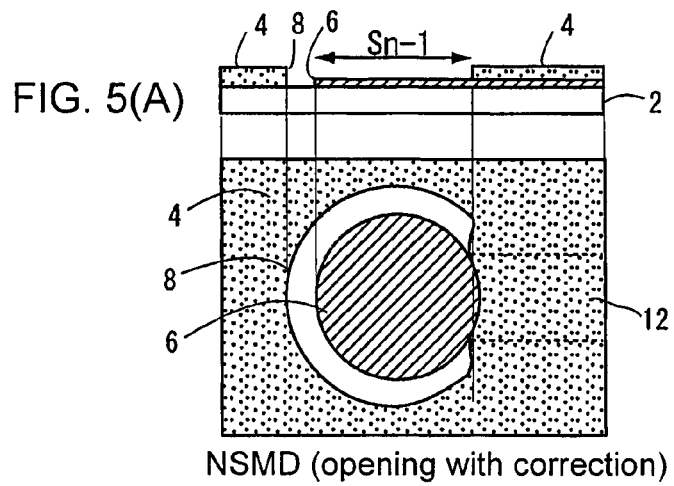
FIG. 5(A) NSMD (opening with correction)
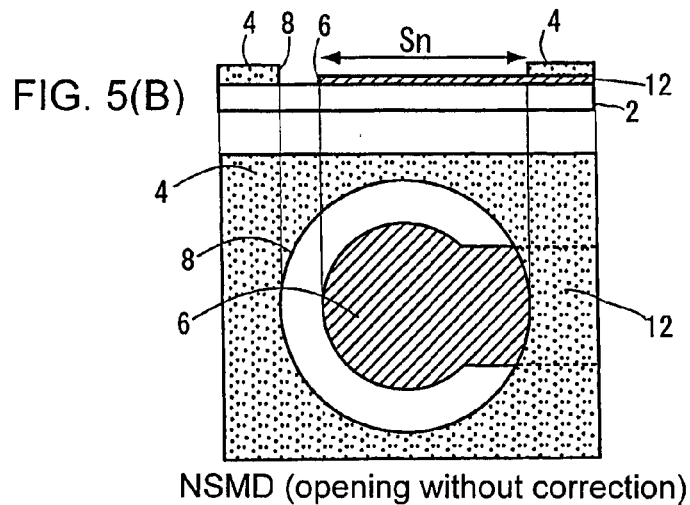
FIG. 5(B) NSMD (opening without correction)
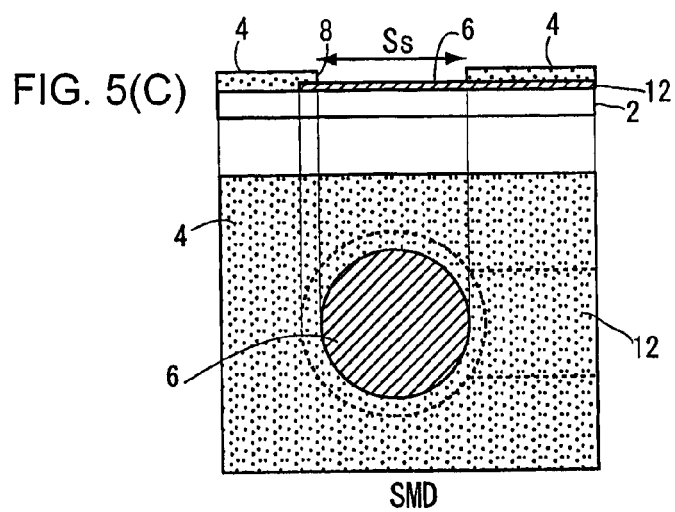
FIG. 5(C) SMD

PRINTED WIRING BOARD AND METHOD FOR MANUFACTURING THE SAME

CROSS-REFERENCE TO RELATED APPLICATIONS

The present application is based upon and claims the benefit of priority to Japanese Patent Application No. 2013-189800, filed Sep. 12, 2013, the entire contents of which are incorporated herein by reference.

BACKGROUND OF THE INVENTION

Field of the Invention

The present invention relates to a printed wiring board and its manufacturing method.

Description of Background Art

In a printed wiring board, multiple electronic components (for example, semiconductor elements such as ICs and LSIs) may be mounted and fixed onto the printed wiring board and may be electrically connected to each other.

Regarding pad structures on a printed wiring board, there are a non-solder mask defined (NSMD) structure and a solder mask defined (SMD) structure (see JP2004-22713A). The entire contents of this publication are incorporated herein by reference.

SUMMARY OF THE INVENTION

According to one aspect of the present invention, a wiring board includes a substrate, pads formed on an electronic-component mounting surface of the substrate, and a resin insulation layer covering the electronic-component mounting surface and having opening portions such that the opening portions are exposing the pads, respectively. The pads include a non-solder mask defined pad having a wiring portion and a non-solder mask defined pad having no wiring portion, and the opening portions are formed such that the non-solder mask defined pads have exposed conductor areas which have substantially same areas inside the opening portions.

According to another aspect of the present invention, a method for manufacturing a wiring board includes forming pads on an electronic-component mounting surface of a substrate, forming a resin insulation layer on the electronic-component mounting surface of the substrate such that the resin insulation layer covers the pads on the electronic-component mounting surface of the substrate, and forming opening portions in the resin insulation substrate such that the opening portions expose the pads, respectively. The forming of pads includes forming a non-solder mask defined pad having a wiring portion and forming a non-solder mask defined pad having no wiring portion, and the forming of the opening portions includes forming exposed conductor areas for the non-solder mask defined pads such that the exposed conductor areas of the non-solder mask defined pads have substantially same areas inside the opening portions.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 3C(B) is a view illustrating the solder region of an NSMD structure;

FIG. 4A(B) is a view of a NSMD structure of a pad with a lead line and an opening without correction;

FIG. 4B(B) is a view of a NSMD structure of a pad with two lead lines and an opening without correction;

FIG. 4C(B) is a view showing a pad with a lead line on the left and a pad without a lead lines on the right according to an embodiment of the present invention;

FIG. 5(A) is a view showing an NSMD structure with a corrected shape of opening 8;

FIG. 5(B) is a view showing an NSMD structure of opening 8 without correction;

FIG. 5(C) is a view showing an SMD structure;

DETAILED DESCRIPTION OF THE EMBODIMENTS

Figure 1A:
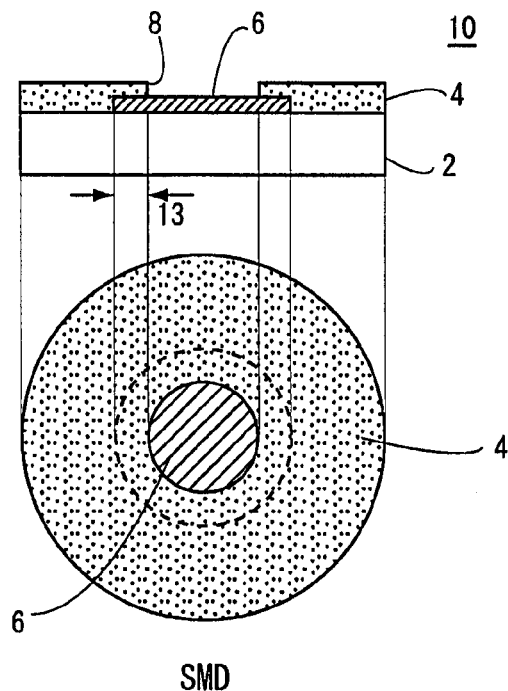
FIG. 1A is a view illustrating an SMD structure with a cross-sectional view shown above and a plan view shown below.

The embodiments will now be described with reference to the accompanying drawings, wherein like reference numerals designate corresponding or identical elements throughout the various drawings.

Figure 1B:
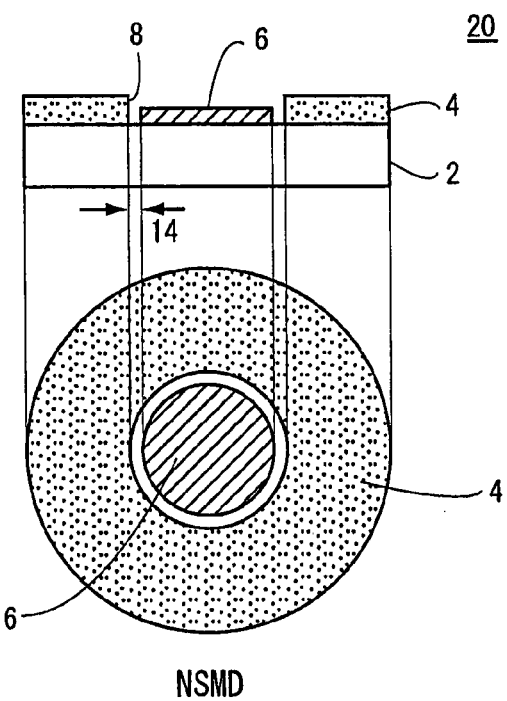
FIG. 1B is a view illustrating an NSMD structure with a cross-sectional view shown above and a plan view shown below.

First, NSMD and SMD structures are described. FIG. 1A shows views illustrating an SMD structure: a cross-sectional view shown above is obtained by slicing the view below with a horizontal line that passes through the center (the same applies to the descriptions in the following), and a plan view is shown below. FIG. 1B shows views illustrating an NSMD structure: a cross-sectional view is shown above, and a plan view is shown below.

In SMD structure 10 shown in FIG. 1A, the diameter of opening 8 of solder mask 4 (also referred to as "SMO," an abbreviation of solder mask opening) is set smaller than the diameter of pad 6, while both are formed to have overlapping portion 13. Because of overlapping portion 13, pad 6 is connected more strongly to base 2. In the present application, a pad of an SMD structure may also be referred to as a "pad with a top-surface portion and side surfaces covered with a resin insulation layer."

In the NSMD structure shown in FIG. 1B, the diameter of opening 8 of solder mask 4 is set greater than the diameter of pad 6 so that gap 14 is formed between them. Since the side surfaces of a pad are also used for solder connection, the area of the pad that contributes to solder connection is greater. However, the neck portion of a lead line extending from the pad tends to be disconnected due to mechanical stress. In the present application, a pad of an NSMD structure may also be referred to as a "pad with top and side surfaces exposed from a resin insulation layer."

As described above, SMD pads and NSMD pads have their respective advantages and disadvantages. Therefore, when a printed wiring board is designed, both NSMD pads and SMD pads are formed in a printed wiring board while taking into consideration their advantages and disadvantages.

Printed Wiring Board

Figure 2A:
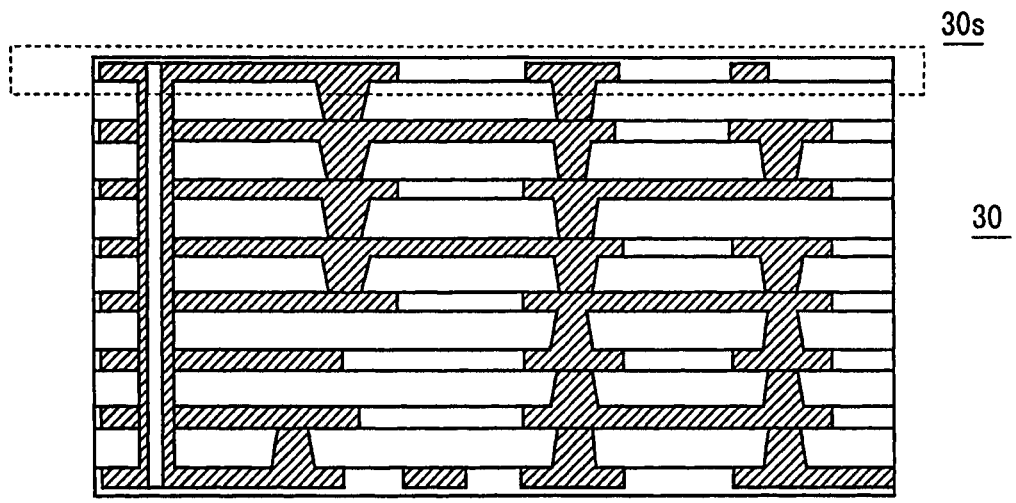
FIG. 2A is a view showing a printed wiring board according to an embodiment of the present invention.

FIG. 2A shows printed wiring board 30 according to an embodiment of the present invention. Printed wiring board 30 is a multilayer wiring board having eight conductive layers, for example, formed by laminating a triple-layered buildup layer on each of both surfaces of a core substrate. However, the present embodiment is characterized by the electronic-component mounting surface (30s) (such as a semiconductor-element mounting surface) of printed wiring board 30, and any desired structure may be employed for the rest of the wiring board. Thus, a basic structure of printed wiring board 30 is briefly described when its manufacturing method is illustrated with reference to FIGS. 6A~6I.

Figure 2B:
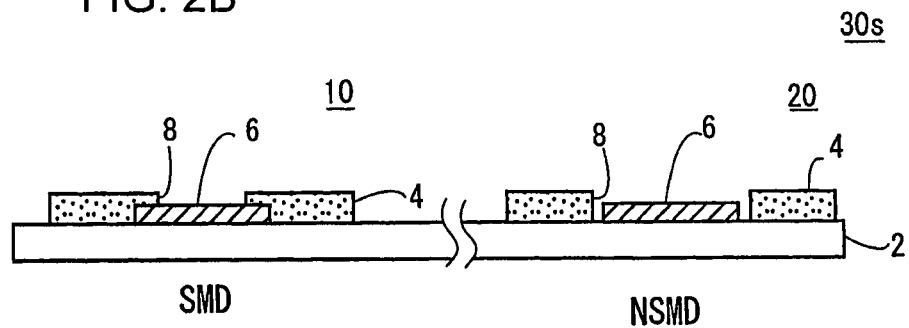
FIG. 2B is a view illustrating the semiconductor-element mounting surface of the printed wiring board in FIG. 2A.

FIG. 2B is a view illustrating semiconductor-element mounting surface (30s) of printed wiring board 30. Semiconductor-element mounting surface (30s) includes both pad 6 of SMD structure 10 and pad 6 of NSMD structure 20. The shape of pads is usually a circle, but it may be any other shape. For example, the present embodiment is also applicable if a pad is elliptical or rectangular.

Study of Properties in Mounting Process

In a printed wiring board having both NSMD pads and SMD pads, mounting yield during procedures for mounting semiconductor elements tends to be lower than that in a printed wiring board formed to have only either type of pad. Thus, the inventors of the present invention conducted extensive studies on the factors that cause a lower yield. As a result, the following was identified.

To form pads for surface mounting, solder paste is supplied by printing or dispensing to pad 6 on semiconductor-element mounting surface (30s) of printed wiring board 30. When a printing method is employed, solder paste is supplied to pad 6 using a screen mask made of stainless steel or the like.

Figure 3A:
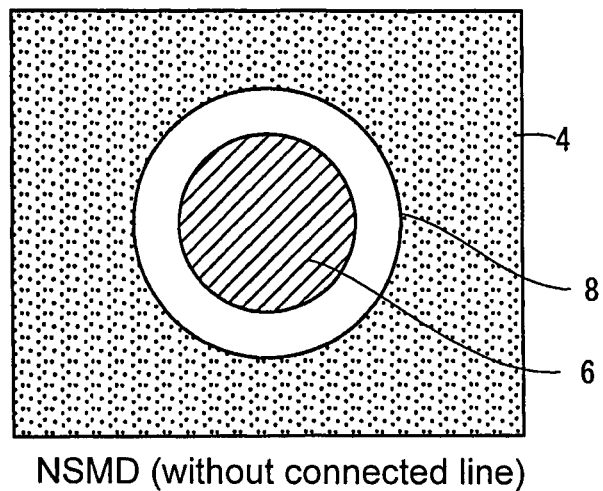
FIG. 3A(A)-3A(B) are views illustrating NSMD structures, where the exposed conductor area in an opening varies depending on the presence of a lead line connected to a pad.
Figure 3A:
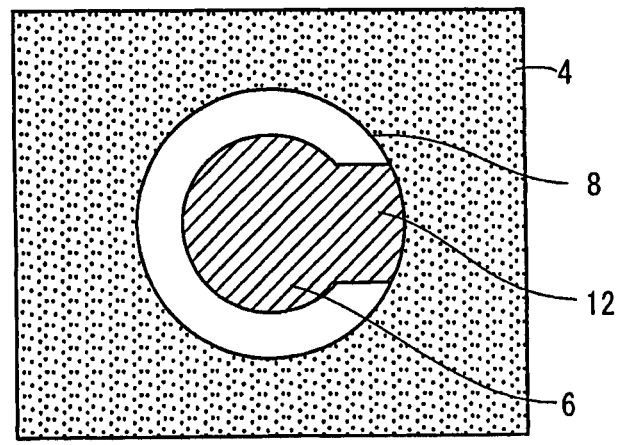

FIG. 3A shows views illustrating NSMD structures, where the size of the exposed conductor area in an opening varies depending on the presence of a lead line connected to pad 6. In an NSMD structure, the exposed conductor area in an opening varies depending on the presence of wiring line 12 connected to pad 6 (also referred to as a "signal lead line" or simply as a "line"). Namely, unlike a pad shown in (A) where no lead line is formed, when a pad has a lead line as shown in (B), the region of the lead line adjacent to pad 6 is also a solder region in addition to the solder region formed on pad 6, and the exposed conductor area in an opening thereby increases. Thus, the amount of solder paste attached to a pad with a lead line is relatively great compared with a pad without a lead line.

Figure 3B:
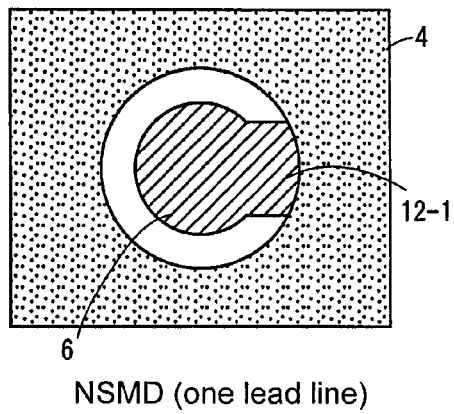
FIG. 3B(A)-3B(D) are views illustrating NSMD structures, where the exposed conductor area in an opening varies depending on the number of lead lines connected to a pad.
Figure 3B:
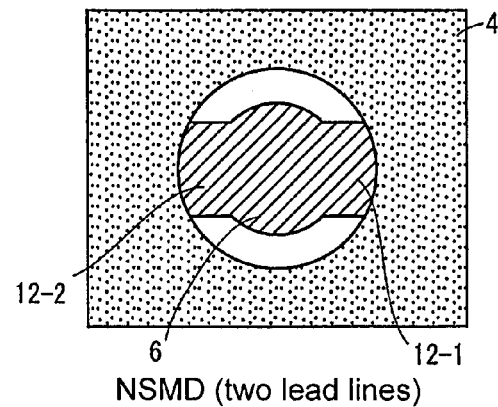
Figure 3B:
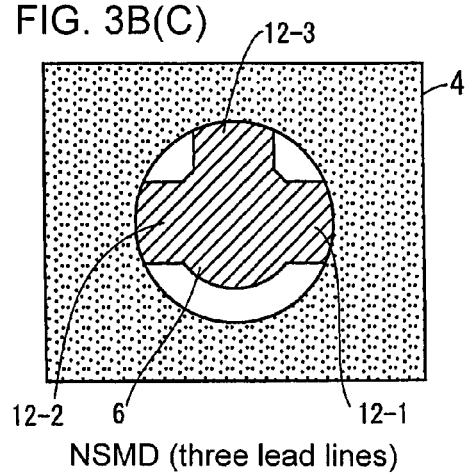
Figure 3B:
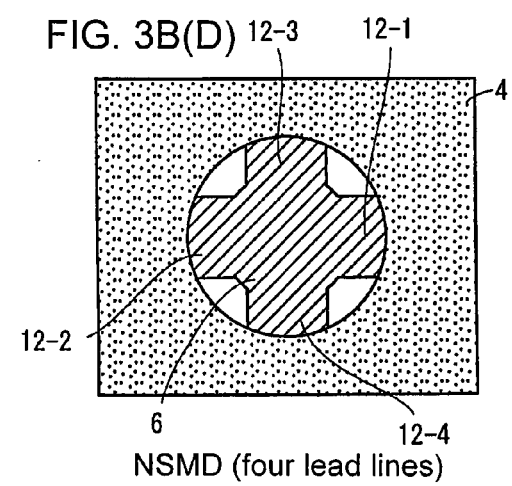

FIG. 3B shows views illustrating how the size of the exposed conductor area in an opening varies depending on the number of lead lines in an NSMD pad. The lead lines connected to a pad are usually set in four directions—to the left, right, above and below—although that is not the only option. FIG. 3B shows a pad with one lead line in (A), a pad with two lead lines in (B), a pad with three lead lines in (C), and a pad with four lead lines in (D). In addition to the region of pad 6, the region of lead line 12 adjacent to each pad is also a solder region. Thus, as the number of lead lines increases, the exposed conductor area in the opening also increases.

Namely, the size of the exposed conductor area in an opening varies depending on the presence of a lead line in NSMD structure 20, and further varies depending on the number of lead lines in an opening.

The area of solder attached on a pad in NSMD structure 20, namely, the size of the exposed conductor area in an opening, was described by referring to FIGS. 3A and 3B. When a semiconductor element is mounted, solder paste is applied on the conductor in an opening, an electrode pad (not shown) of a semiconductor element is aligned to the pad, and the solder is reflowed. At that time, since fused solder spreads over the entire conductor in the opening, the size of the exposed conductor area in an opening makes a difference in the height of the solder (the height measured from the pad surface of the printed wiring board). Moreover, when the amount of solder paste is the same in the reflow process, if the exposed conductor area in an opening increases, the height of fused solder decreases, whereas if the exposed conductor area in an opening decreases, the height of fused solder increases.

Figure 3C:
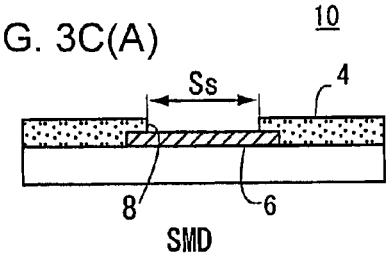
FIG. 3C(A) is a view illustrating the solder region of an SMD structure.
Figure 3C:
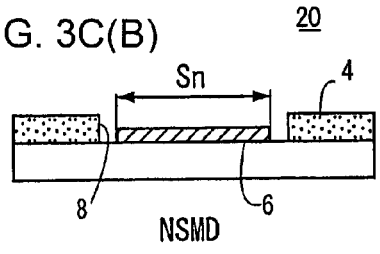

Furthermore, as shown in FIG. 3C, the side surfaces of pad 6 are covered with solder resist 4 in SMD structure 10 shown in (A). By contrast, in NSMD structure 20 shown in (B), the side surfaces of pad 6 are exposed inside solder-resist opening 8. Thus, even when the exposed conductor area (Ss) of SMD structure 10 is equal to the exposed conductor area (Ss) of NSMD structure 20, fused solder spreads around the side surfaces of the pad of NSMD structure 20, thus making the height of solder relatively low.

Considering the above, the inventors of the present invention propose a method for setting the exposed conductor area in each opening to be uniform so as to solve the above-mentioned problem. The proposed method is described below. In the following, an example is described where the outermost layer of a semiconductor-element mounting surface is solder resist. However, when the outermost layer of a printed wiring board covers an insulation sheet, the outermost layer may be the insulation sheet or an insulation layer.

(1) If a printed wiring board has only NSMD structure 20, the shapes of solder-resist openings 8 are corrected so that the exposed conductor areas (Sn) in the openings are set to be equal to each other.

(2) If a printed wiring board has both SMD structure 10 and NSMD structure 20, the shapes of openings 8 in the solder resist are corrected so that exposed conductor areas (Ss, Sn) in the openings are set to be equal to each other.

(3) To correct shapes of openings 8 in solder resist 4, solder resist 4 covers lead line(s) 12.

Figure 4A:
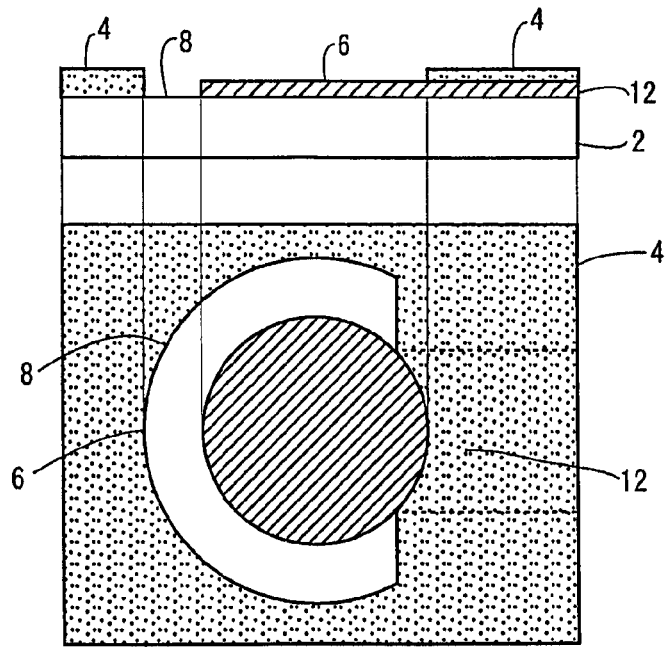
FIG. 4A(A) is a view of a NSMD structure of a pad with a lead line and an opening with a corrected shape.
Figure 4A:
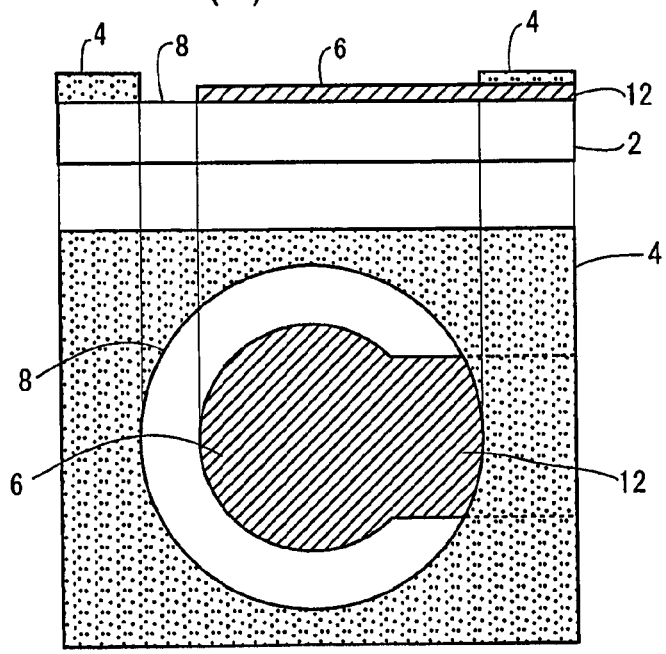

FIG. 4A shows views of SMD pads with one lead line to compare an opening with a corrected shape shown in (A) and an opening without correction shown in (B). To correct the shape of an opening in solder resist 4 as shown in (A), it may be any shape as long as lead line 12 is covered with solder resist 4. For example, it may be a partially circular shape by cutting part of the circular opening substantially straight as shown in (A). Alternatively, it may be a partially circular shape by cutting a rectangle corresponding to the shape of lead line 12 from the circular opening.

Figure 4B:
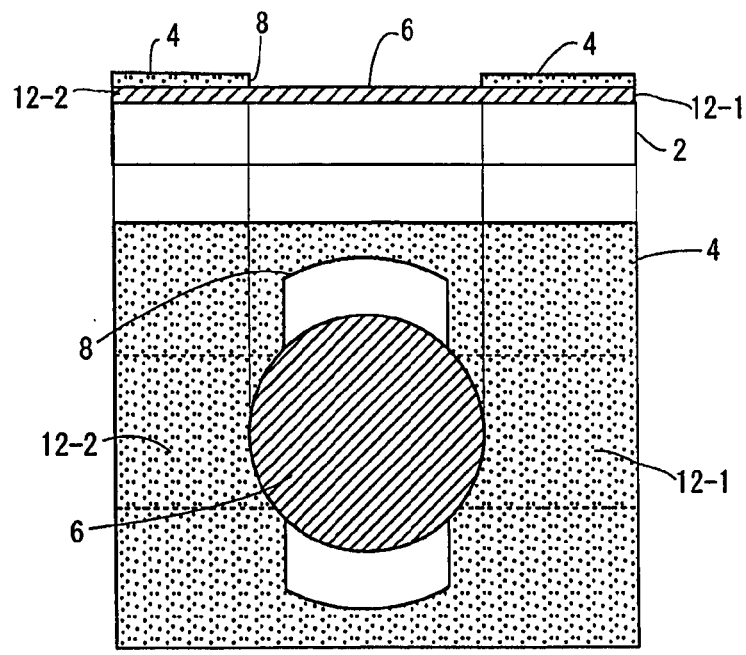
FIG. 4B(A) is a view of a NSMD structure of a pad with two lead lines and an opening with a corrected shape.
Figure 4B:
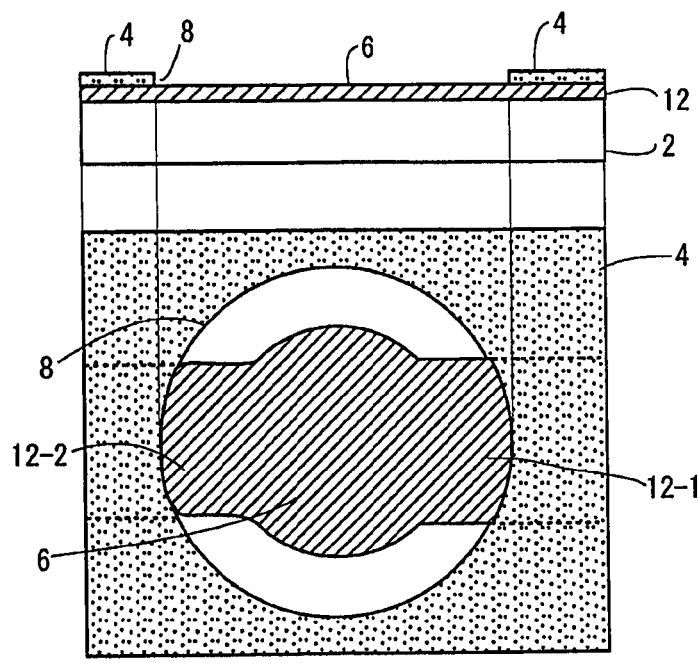

FIG. 4B shows views of NSMD pads with two lead lines to compare an opening with a corrected shape shown in (A) and an opening without correction shown in (B). To correct the shape of an opening, solder resist 4 covers two lead lines (12-1, 12-2) as shown in (A). The same applies to those in FIG. 3B, namely, a pad with three lead lines shown in (C), and a pad with four lead lines shown in (D). When there are only NSMD pads 20, solder resist 4 covers lead lines 12 so that exposed conductor areas (Sn) are set to be equal to each other.

Figure 4C:
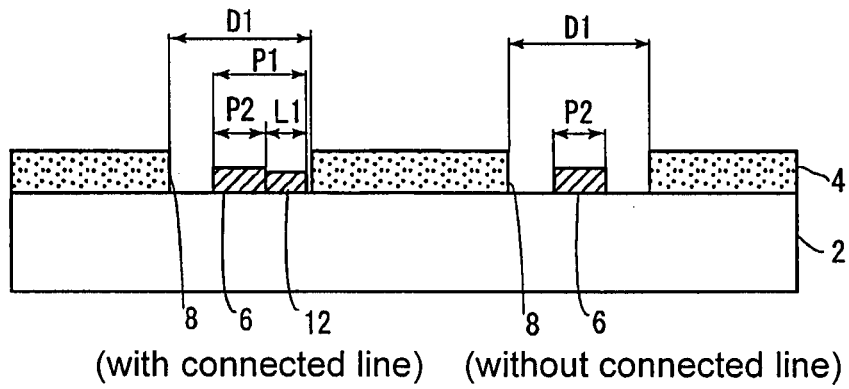
FIG. 4C(A) is a view showing a pad with a lead line on the left and a pad without a lead lines on the right according to conventional technology.
Figure 4C:
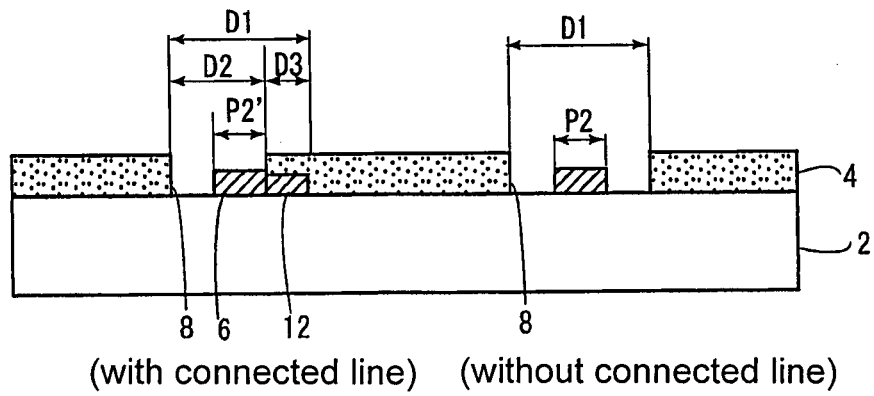

FIG. 4C shows views to compare conventional technology shown in (A) and the present embodiment shown in (B). In each view, pad 6 with lead line 12 is shown on the left and pad 6 without a lead line is shown on the right.

In the conventional technology shown in (A), each diameter (D1) of openings 8 in the solder resist is the same regardless of a lead line. The diameter of pad 6 is referred to as (P2) and the region of lead line 12 adjacent to the pad (namely, the line solder region) as (L1), and the pad on the left where a lead line is formed is compared with the pad on the right where no lead line is formed. In pad 6 with a lead line, the solder region (P1) is the sum of pad region (P2) and line solder region (L1). Thus, solder region (P1) is greater than solder region (P2) of a pad without a lead line.

By contrast, in pad 6 with a lead line according to the present embodiment shown in (B), region (D3) corresponding to the solder region of the lead line is covered by solder resist 4. Thus, since region (D2) of opening 8 for pad 6 with a lead line is reduced from region (D1) by the size of region (D3), region (D2) is smaller than region (D1) of opening 8 for pad 6 without a lead line. Regarding the solder region of pad 6 with a lead line, it is corrected to be region (P2'), which is substantially equal to the area of pad 6, and thus it is closer to region (P2) of pad 6 without a lead line.

FIG. 5 shows views to compare an NSMD structure with a corrected shape of opening 8 shown in (A), an NSMD structure of opening 8 without correction shown in (B), and an SMD structure show in (C). When exposed conductor area (Sn−1) of the NSMD structure (opening with correction) shown in (A) is compared with exposed conductor area (Sn) of the NSMD structure (opening without correction) shown in (B), the exposed conductor area (Sn−1) is reduced by the portion where solder resist 4 covers lead line 12. When there are pads of both NSMD structure 20 and SMD structure 10, exposed conductor area (Sn−1) of the NSMD structure (opening with correction) shown in (A) is set approximately equal to the exposed conductor area (Ss) of the SMD structure by covering lead line 12 with solder 4. Here, a pad with one lead line is described, but the same applies to pads with 2-4 lead lines described with reference to FIG. 3B.

As a result of correcting the shape of the opening, exposed conductor area (Sn−1) of an NSMD structure (opening with correction) was within ±15% of exposed conductor area (Ss) of an SMD structure.

Method for Manufacturing Printed Wiring Board
Main Body of Printed Wiring Board

FIG. 6A~6E are views illustrating a method for manufacturing printed wiring board 30 shown in FIG. 2A. The present embodiment is characterized by semiconductor-element mounting surface (30S) of printed wiring board 30, and any desired structure may be employed for the rest of the wiring board. Thus, its manufacturing method is briefly described below.

Figure 6A:
FIG. 6A is a view, along with other views, illustrating a method for manufacturing a printed wiring board.

As shown in FIG. 6A, double-sided copper-clad laminate 40 is prepared as a starting material. Generally, copper foil is formed on both surfaces of an epoxy-resin sheet that is reinforced with glass cloth.

Figure 6B:
FIG. 6B is a view, along with other views, illustrating the method for manufacturing a printed wiring board.

As shown in FIG. 6B, via-hole openings are formed by a laser.

Figure 6C:
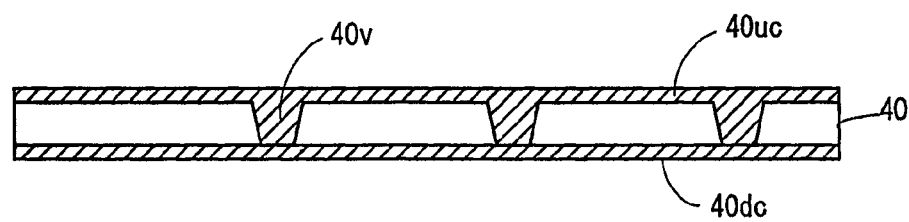
FIG. 6C: a view, along with other views, illustrating the method for manufacturing a printed wiring board.

As shown in FIG. 6C, electroless copper plating is performed on both surfaces and in the openings of double-sided copper-clad laminate 40, and electrolytic copper plating is performed by using the electroless copper plated film as an electrode. Accordingly, first filled-via conductors (40*v*), first upper conductive layer (40*uc*) and first lower conductive layer (40*dc*) are formed.

Figure 6D:
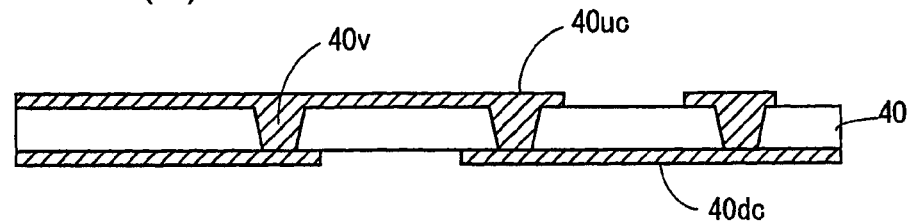
FIG. 6D is a view, along with other views, illustrating the method for manufacturing a printed wiring board.

As shown in FIG. 6D, first upper conductive layer (40*uc*) and first lower conductive layer (40*dc*) are patterned by lithographic technique to form circuit patterns. A core substrate is completed.

Figure 6E:
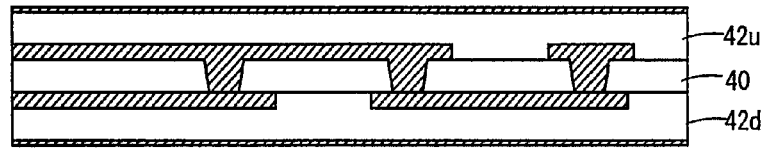
FIG. 6E is a view, along with other views, illustrating the method for manufacturing a printed wiring board.

As shown in FIG. 6E, first upper buildup layer (42*u*) and first lower buildup layer (42*d*) are respectively formed on the surfaces of the core substrate. Each buildup layer is made of copper foil covered with prepreg or resin-coated foil (RCF: copper foil with adhesive).

Figure 6F:
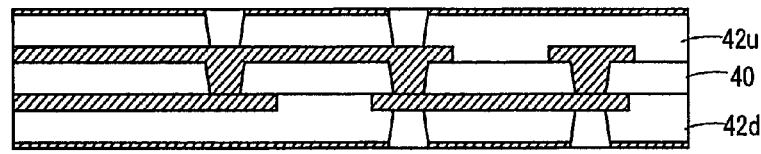
FIG. 6F is a view, along with other views, illustrating the method for manufacturing a printed wiring board.

As shown in FIG. 6F, via-hole openings are formed by a laser. The step in FIG. 6F is the same as in FIG. 6B.

Figure 6G:
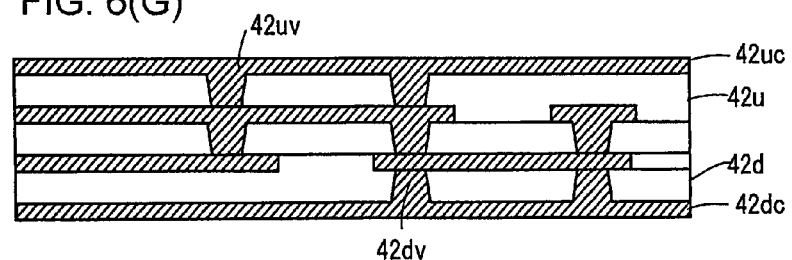
FIG. 6G is a view, along with other views, illustrating the method for manufacturing a printed wiring board.

As shown in FIG. 6G, copper plating is performed on both surfaces and inside openings. The step in FIG. 6G is the same as in FIG. 6C. Accordingly, second filled-via conductors (42*uv*), second upper conductive layer (42*uc*) and second lower conductive layer (42*dc*) are formed.

Figure 6H:
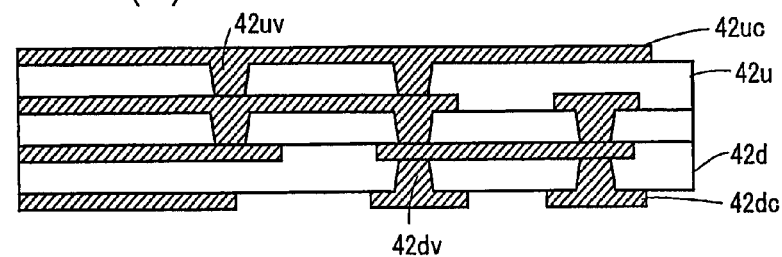
FIG. 6H is a view, along with other views, illustrating the method for manufacturing a printed wiring board.

As shown in FIG. 6H, second upper conductive layer (42*uc*) and second lower conductive layer (42*dc*) are patterned to form circuit patterns. The step in FIG. 6H is the same as in FIG. 6D.

Moreover, steps shown in FIG. 6E~6H are repeated a desired number of times. Here, steps shown in FIG. 6E~6H are repeated twice, second upper buildup layer (44*u*) and second buildup layer (44*d*) are formed, and third upper buildup layer (46*u*) and third buildup layer (46*d*) are further formed as shown in FIG. 6I.

Semiconductor-Element Mounting Surface

Since the present embodiment is characterized by semiconductor-element mounting surface (30s) of printed wiring board 30 (see FIG. 2A), the following is a description of a method for forming a semiconductor-element mounting surface as shown in FIGS. 7A~7D.

Figure 6I:
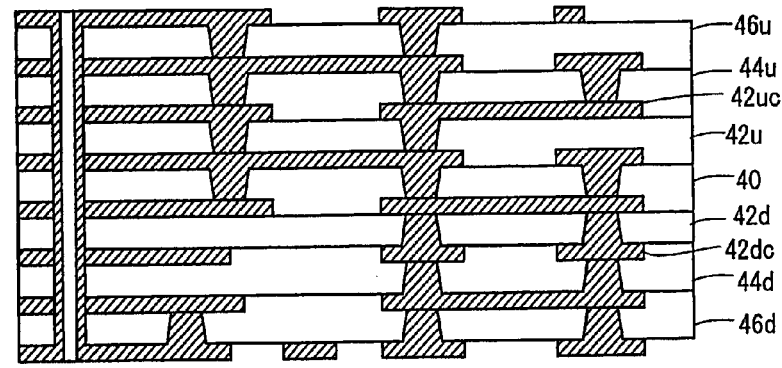
FIG. 6I is a view, along with other views, illustrating the method for manufacturing a printed wiring board.
Figure 7A:
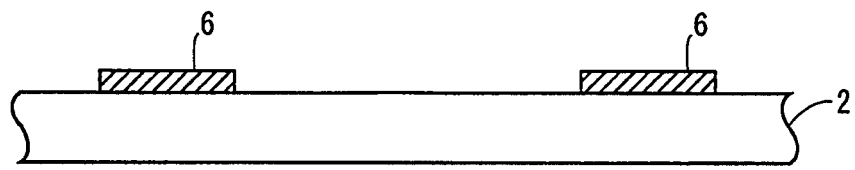
FIG. 7A is a view, along with other views, illustrating a method for forming a semiconductor-element mounting surface of a printed wiring board.

The substrate indicated by reference numeral 2 in FIG. 7A may be any desired substrate, for example, it may be a substrate manufactured as shown in FIGS. 6A~6I and obtained at the final step in FIG. 6I. A pad indicated by reference numeral 6 corresponds to the pad formed in third upper conductive layer (46uc) in third upper buildup layer (46u).

Figure 7B:
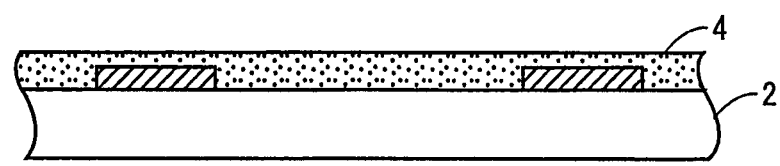
FIG. 7B is a view, along with other views, illustrating the method for forming a semiconductor-element mounting surface of a printed wiring board.

As shown in FIG. 7B, solder-resist layer (protective insulation layer) 4 is formed. For example, liquid photoresist is used. However, a dry film type may also be used.

Figure 7C:
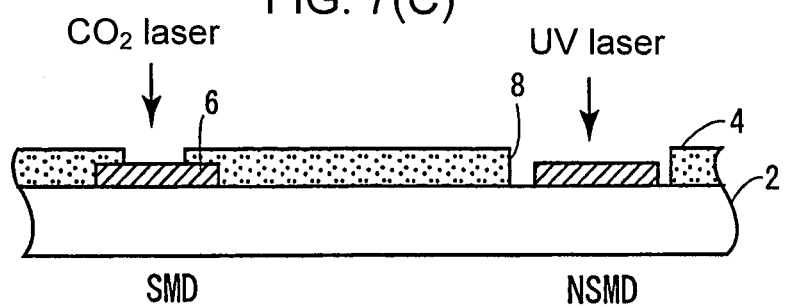
FIG. 7C is a view, along with other views, illustrating the method for forming a semiconductor-element mounting surface of a printed wiring board.

As shown in FIG. 7C, opening 8 is formed in upper solder-resist layer 4 positioned on pad 6. When it is photosensitive solder resist, openings are formed by lithographic technique, or by a laser. When it is an SMD structure, since its base is a pad, a $CO_2$ gas laser is used for forming an opening, whereas when it is an NSMD structure, a UV laser is used so as not to damage the substrate resin formed underneath.

Figure 7D:
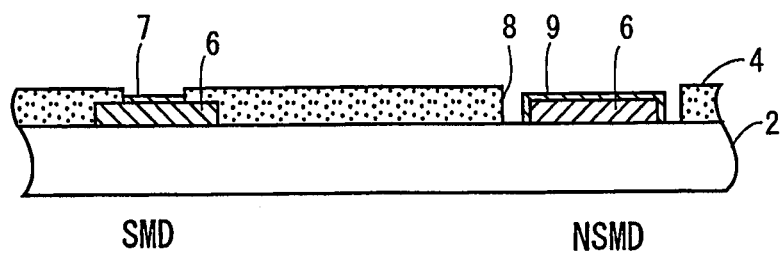
FIG. 7D is a view, along with other views, illustrating the method for forming a semiconductor-element mounting surface of a printed wiring board.

As shown in FIG. 7D, nickel-gold plating 7 is performed on the surfaces of SMD and NSMD pads 6 to prevent surface oxidation. Instead of nickel-gold plating, OSP (organic solderability preservative) layer 9 may also be formed on the surfaces of SMD and NSMD pads to prevent surface oxidation. OSP is a surface-treatment coating agent to prevent surface oxidation of the conductive layer on a pad before an electronic component is mounted on a printed wiring board. Usually, since OSP is water soluble and attaches only to copper such as pads, masking or the like is not necessary. Accordingly, a printed wiring board is completed to have both SMD pads and NSMD pads.

For high-density mounting on recent electronic circuit boards, printed wiring boards may mount semiconductor elements by using surface-mounting technology. Thus, on the semiconductor-element mounting surface of a printed wiring board, pads for loading solder (referred to as "pads") may be formed, and solder bumps may be formed on those pads.

In a printed wiring board having both NSMD pads and SMD pads, the yield of mounting semiconductor elements tends to be lower than that in a printed wiring board formed to have only either type of pad.

A printed wiring board according to an embodiment of the present invention exhibits excellent properties in the process of mounting semiconductor elements, and a method for manufacturing a printed wiring board according to an embodiment of the present invention produces such a printed wiring board.

A printed wiring board according to an embodiment of the present invention has an electronic-component mounting surface formed on one of its surfaces, multiple pads formed on the electronic-component mounting surface, and a resin insulation layer which covers the electronic-component mounting surface and includes multiple openings for respectively exposing the multiple pads. In such a printed wiring board, the multiple pads include a pad whose top and side surfaces are exposed from the resin insulation layer, and the shape of an opening for the pad with exposed top and side surfaces is corrected so that the exposed conductor area of the pad in the opening is set closer to the exposed conductor area in another opening, which is among the multiple openings, but which is not for the pad with exposed top and side surfaces.

Moreover, in the printed wiring board, the shape of the opening may be corrected by using the resin insulation layer to cover a wiring line connected to the pad.

Yet moreover, on the electronic-component mounting surface, the printed wiring board may further include a pad that has a top-surface portion and side surfaces covered with a resin insulation layer. The shape of an opening for the pad with exposed top and side surfaces may be corrected by using the resin insulation layer to cover the periphery of the pad so that its exposed conductor area in the opening is set closer to the exposed conductor area in the opening for the pad where a top-surface portion and side surfaces are covered with the resin insulation layer.

Yet moreover, in the printed wiring board, the difference between the exposed conductor area of the pad in the opening with a corrected shape and the exposed conductor area of a pad in the opening without correction may be within 15%.

Yet moreover, in the printed wiring board, the resin insulation layer may be made of solder resist.

Yet moreover, in the printed wiring board, the shape of an opening may be circular, elliptical, or rectangular.

Yet moreover, in the printed wiring board, nickel-gold plating or an OSP layer may be formed on pad surfaces.

A method for manufacturing a printed wiring board related to the present invention includes the following: on an electronic-component mounting surface formed on one of its surfaces, forming a pad whose top and side surfaces are exposed from a resin insulation layer; and on the electronic-component mounting surface, forming a resin insulation layer with an opening in a position corresponding to the pad. When forming the resin insulation layer, the shape of an opening for the pad with exposed top and side surfaces is corrected so that the exposed conductor area of the pad in the opening is set closer to the exposed conductor area in another opening, which is among the multiple openings, but which is not for the pad with exposed top and side surfaces.

Moreover, in the method for manufacturing a printed wiring board, the shape of the opening may be corrected by using the resin insulation layer to cover a wiring line connected to the pad.

Yet moreover, in the method for manufacturing a printed wiring board, a pad whose top-surface portion and side surfaces are covered by the resin insulation layer may also be formed on the electronic component mounting surface. The shape of an opening for the pad with exposed top and side surfaces may be corrected by covering the periphery of the pad with the resin insulation layer so that the exposed conductor area of the pad in the opening is set closer to the exposed conductor area in the opening for the pad whose top-surface portion and side surfaces are covered with the resin insulation layer.

A printed wiring board according to an embodiment of the present invention and a manufacturing method according to an embodiment of the present invention exhibit excellent properties in the process of mounting semiconductor elements.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring board, comprising:
   a substrate;
   a plurality of pads formed on an electronic-component mounting surface of the substrate; and a resin insulation layer covering the electronic-component mounting surface and having a plurality of opening portions such that the plurality of opening portions is exposing the plurality of pads, respectively, wherein the plurality of pads includes a non-solder mask defined pad having a wiring portion and a non-solder mask defined pad having no wiring portion, and the plurality of opening portions is formed such that the non-solder mask defined pads have exposed conductor areas which have substantially same areas inside the opening portions.

2. A wiring board according to claim 1, wherein the plurality of opening portions is formed such that the resin insulation layer is covering the wiring portion of the non-solder mask defined pad such that the non-solder mask defined pads have exposed conductor areas which have substantially same areas inside the opening portions.

3. A wiring board according to claim 1, wherein the plurality of pads includes a solder mask defined pad, and the non-solder mask defined pad has a peripheral portion which is covered by the resin insulation layer such that the exposed conductor area of the non-solder mask defined pad is set substantially same as the exposed conductor area of the solder mask defined pad.

4. A wiring board according to claim 1, wherein the plurality of pads includes a solder mask defined pad, and the plurality of opening portions is formed such that the solder mask defined pad and the non-solder mask defined pad have exposed conductor areas which have substantially same areas within a difference of 15% or less inside the opening portions.

5. A wiring board according to claim 1, wherein the resin insulation layer is a solder resist layer, and the plurality of opening portions is formed such that one of the openings forming the non-solder mask defined pad having the wiring portion has an opening area which is smaller than an opening area of one of the openings forming the non-solder mask defined pad having no wiring portion.

6. A wiring board according to claim 1, wherein the plurality of opening portions has at least one of a circular form, an oval form and a rectangular form.

7. A wiring board according to claim 1, wherein the pads have surface layers comprising one of a nickel-gold plated layer and an OSP layer.

8. A wiring board according to claim 2, wherein the plurality of pads includes a solder mask defined pad, and the plurality of opening portions is formed such that the solder mask defined pad and the non-solder mask defined pad have exposed conductor areas which have substantially same areas within a difference of 15% or less inside the opening portions.

9. A wiring board according to claim 3, wherein the plurality of opening portions is formed such that the solder mask defined pad and the non-solder mask defined pad have exposed conductor areas which have substantially same areas within a difference of 15% or less inside the opening portions.

10. A wiring board according to claim 7, wherein the plurality of pads includes a solder mask defined pad, and the plurality of opening portions is formed such that the solder mask defined pad and the non-solder mask defined pad have exposed conductor areas which have substantially same areas within a difference of 15% or less inside the opening portions.

* * * * *